US011829198B2

(12) United States Patent
Gajda et al.

(10) Patent No.: US 11,829,198 B2
(45) Date of Patent: *Nov. 28, 2023

(54) CLOCK CIRCUIT PORTIONS

(71) Applicant: Nordic Semiconductor ASA, Trondheim (NO)

(72) Inventors: Bartosz Gajda, Trondheim (NO); Frode Pedersen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

This patent is subject to a terminal disclaimer.

(21) Appl. No.: 17/868,606

(22) Filed: Jul. 19, 2022

(65) Prior Publication Data

US 2022/0350364 A1 Nov. 3, 2022

Related U.S. Application Data

(63) Continuation of application No. 17/127,770, filed on Dec. 18, 2020, now Pat. No. 11,429,134.

(30) Foreign Application Priority Data

Dec. 20, 2019 (GB) ..................................... 1918967

(51) Int. Cl.
*G06F 1/08* (2006.01)
*H03K 5/02* (2006.01)
*H03K 5/00* (2006.01)

(52) U.S. Cl.
CPC ........... *G06F 1/08* (2013.01); *H03K 5/00006* (2013.01); *H03K 5/02* (2013.01)

(58) Field of Classification Search
CPC ... H03L 7/07; H03L 7/18; H03L 7/099; H03L 7/093; H03L 7/183; H03L 7/08;
(Continued)

(56) References Cited

U.S. PATENT DOCUMENTS 10,802,127 B2 * 10/2020 Mueller ................ G01F 23/244
2010/0148881 A1 * 6/2010 Moussavi ............. H03L 7/0814
327/156
(Continued)

FOREIGN PATENT DOCUMENTS

EP 3 435 547 A1 1/2019

*Primary Examiner* — John W Poos
(74) *Attorney, Agent, or Firm* — Klarquist Sparkman, LLP

(57) ABSTRACT

A method is disclosed for producing an output clock signal with a target frequency using an oscillator circuit portion configured to receive a control value and produce an output clock signal with a frequency dependent on the control value. In one embodiment, the method comprises providing a first control value to the oscillator circuit portion corresponding to the target frequency, so as to cause the oscillator circuit portion to produce the output clock signal with a first frequency, comparing the output clock signal with a reference clock signal having a reference frequency to determine an offset between the first frequency and the target frequency, and providing a second control value to the oscillator circuit portion that differs from the first control value by a magnitude calculated with reference to the determined offset, to cause the oscillator circuit portion to produce the output clock signal with a second frequency.

19 Claims, 9 Drawing Sheets

(58) Field of Classification Search
CPC . H03L 7/085; H03L 1/026; H03L 7/10; H03L 2207/50; H03L 1/00; H03L 2207/06; H03L 7/06; H03L 7/23; H03L 7/00; H03L 7/1976; H03L 7/087; H03L 7/0992; H03L 7/16; H03L 7/0991; H03L 7/0995; H03L 7/1974; H03L 7/0891; G06F 1/08; G06F 1/10

See application file for complete search history.

(56) References Cited

U.S. PATENT DOCUMENTS

| | | |
|---|---|---|
| 2011/0018641 A1 | 1/2011 | Huang et al. |
| 2012/0218014 A1 | 8/2012 | Burg et al. |
| 2017/0324417 A1 | 11/2017 | Leibowitz et al. |
| 2019/0165797 A1* | 5/2019 | Miro Panades ......... H03L 7/181 |
| 2021/0255661 A1* | 8/2021 | Fredenburg ........... H03L 7/1075 |

* cited by examiner

CLOCK CIRCUIT PORTIONS

CROSS REFERENCE TO RELATED APPLICATION

This application is a continuation of U.S. application Ser. No. 17/127,770, filed Dec. 18, 2020, which application claims priority to United Kingdom Patent Application No. 1918967.9, filed on Dec. 20, 2019. Both applications are incorporated herein by reference in their entirety.

FIELD

The present invention relates to circuit portions for generating clock signals.

BACKGROUND

Integrated circuits, such as those present in radio frequency transmitters or receivers often comprise controllable oscillator circuits (e.g. voltage-controlled oscillators) arranged to provide clock signals with different frequencies to different circuits or for use in different modes of operation. The frequency of the clock signal is controlled by varying an input parameter to the oscillator circuit (e.g. an input voltage or a digital input value).

A controllable oscillator circuit is normally designed to have a certain (predefined) relationship between the input parameter and the frequency of its output clock signal. During manufacture, this relationship may be calibrated to account for manufacturing variances. During use, however, the environmental conditions (e.g. ambient temperature) in which the circuit is operated may vary, causing the output frequency to drift from its predefined value for a given input parameter. Oscillators are therefore often operated in a closed-loop mode, in which the frequency of the output signal is compared to its predefined (i.e. target) value using a reference signal. In contrast, in an open-loop mode the frequency of the output signal is not monitored and thus may be more susceptible to frequency drift.

A ratio between the (usually many times lower) frequency of the reference signal and that of the output signal is compared to an expected ratio (i.e. if the output signal had its predefined frequency), and any deviations compensated for with a feedback loop that adjusts the input parameter accordingly. Typically, changes in ambient temperature or other factors affecting the oscillation frequency happen relatively slowly (e.g. compared to a reference clock frequency of tens of kHz or more). The resulting frequency drift can therefore typically be corrected simply by changing the input parameter by a small fixed amount in the desired direction (e.g. to increase or decrease the output frequency toward the target) with every cycle of the reference clock for which a deviation is detected. This is referred to as "crawling" towards the target frequency.

Feedback implemented by crawling is often used because it requires only simple circuitry, but it is not optimal for all circumstances and alternative approaches are desired.

SUMMARY

When viewed from a first aspect, a method is disclosed of producing an output clock signal with a target frequency using an oscillator circuit portion configured to receive a control value and produce an output clock signal with a frequency dependent on the control value; wherein the method comprises:

providing a first control value to the oscillator circuit portion corresponding to the target frequency according to a predetermined nominal relationship, so as to cause the oscillator circuit portion to produce the output clock signal with a first frequency;

comparing the output clock signal with a reference clock signal having a reference frequency to determine an offset between the first frequency and the target frequency; and providing a second control value to the oscillator circuit portion that differs from the first control value by a magnitude calculated with reference to the determined offset, so as to cause the oscillator circuit portion to produce the output clock signal with a second frequency.

When viewed from a second aspect, a clock circuit portion is disclosed configured to produce an output clock signal with a target frequency comprising:
  a controller configured to output a control value;
  an oscillator configured to receive the control value and produce an output clock signal with a frequency dependent on the control value; and
  a reference clock input configured to receive a reference clock signal having a reference frequency;
  wherein the controller is configured:
  to output a first control value corresponding to the target frequency according to a predetermined nominal relationship, so as to cause the oscillator to produce the output clock signal with a first frequency;
  to compare the output clock signal with the reference clock signal to determine an offset between the first frequency and the target frequency;
  to output a second control value that differs from the first by a magnitude calculated with reference to the determined offset so as to cause the oscillator to produce the output clock signal with a second frequency.

Thus it will be seen by those skilled in the art that because the second control value differs from the first by a magnitude calculated with reference to the determined offset, the target frequency may be approached more quickly (i.e. within fewer cycles of the reference clock signal) than in previous methods (e.g. in which the oscillator simply crawls towards the target frequency at a fixed rate). This is particularly useful in scenarios where the first frequency is far from the target frequency (e.g. on start-up, when transitioning from open-loop to closed-loop operation or when switching target frequencies) such that crawling at a fixed rate would require many cycles of the reference clock signal. Instead, if the determined offset between the first frequency and the target frequency is large, the second control value may differ significantly from the first control value (i.e. not simply by a fixed amount), resulting in the second frequency being closer to the target frequency than may be achieved with a simple crawling solution within the same timeframe. Achieving the target frequency more quickly is beneficial because it can save power.

In some sets of embodiments, comparing the output clock signal with the reference clock signal comprises counting a number of cycles of the output clock signal elapsing within a predetermined number of cycles of the reference clock signal. This may be achieved using a simple counter. The predetermined number of cycles used may be very small (e.g. as few as one or two cycles), especially when the target frequency is many times larger than the reference frequency.

The first control value is selected according to the predetermined nominal relationship (i.e. determined prior to operation proper of the circuit portion) between the control value and the frequency of the output clock signal. The nominal relationship may comprise a predefined relationship specified during initial design of the oscillator (i.e. with no reference to the actual response of the oscillator). However, in some embodiments, the nominal relationship may be calculated during manufacture (i.e. factory-set) using a calibration procedure to compensate for manufacturing variations. The nominal relationship may comprise a linear gradient or slope. However this is not essential and more complex relationships can also be envisaged.

The actual relationship between the control value and the frequency of the output clock signal may vary dependent on the specific conditions in which the clock circuit portion is operated (e.g. ambient environmental conditions such as temperature or humidity, or other parameters such as a supply voltage or the presence/absence of electrical interference). For reasons of manufacturing efficiency however, calibration procedures are typically carried out in only one set of ambient conditions (e.g. chosen to reflect typical use conditions). Thus even a calibrated nominal relationship cannot ensure accurate operation in all conditions.

However, because the second control value is determined with reference to the determined offset, operational variations in the relationship between the control value and the output frequency can be quickly and efficiently compensated for. The second control value may be calculated with reference to the nominal relationship between control value and frequency of the output clock signal. In other words, the correction (i.e. the magnitude of the difference between the first and second control values) may be calculated using at least some aspect of the predetermined nominal relationship (e.g. the gradient thereof).

In some implementations using only this approach (i.e. that does not take current operating conditions into account) each time to produce the second control value may be sufficient. However, in some embodiments it is advantageous to utilise an operational relationship (i.e. a relationship dependent on at least one operating condition) when producing the second control value. Taking into account the effect of one or more current operating condition(s) (e.g. temperature, humidity, supply voltage) may allow the target frequency to be more quickly and/or more accurately obtained.

In some sets of embodiments therefore the clock circuit portion may be arranged to store a plurality of operational relationships for different operating conditions e.g. for different ambient temperature bins). In such embodiments, the method may comprise measuring at least one operating condition (e.g. temperature, humidity, supply voltage) and then recalling a corresponding operational relationship between the control value and the frequency of the output clock signal. The magnitude change between the first and second control values may then be calculated with reference to the recalled operational relationship. The at least one operating condition may comprise a single condition (e.g. temperature) or a particular combination of conditions.

In such embodiments the plurality of operational relationships could be pre-set (e.g. in a factory as part of an extended calibration process). However, determining and storing the plurality of operational relationships during manufacture may be time-consuming and increase costs. Furthermore, storing a large number of operational relationships when only a small (or even one) might ever be used (e.g. for chips that are only ever operated in one particular set of operating conditions) is inefficient. In a set of embodiments therefore, the method comprises determining an operational relationship during operation. For example, the method may further comprise:

measuring the second frequency;
calculating a difference between the first frequency and the second frequency;
determining an operational relationship between control value and frequency of the output clock signal;
selecting a third control value with reference to the determined operational relationship; and providing said third control value to the oscillator circuit portion so as to cause the output clock signal to produce the output clock signal with a third frequency.

The third control value is thus calculated using an operational relationship (i.e. one determined for the actual conditions in which the circuit is being operated), and the third frequency is thus more likely to be near or equal to the desired target frequency.

Measuring the second frequency may comprise counting a number of cycles of the output clock signal elapsing within a predetermined number of cycles of the reference clock signal. The predetermined number of cycles may be the same as the predetermined number of cycles used to count cycles of the output clock signal to determine the first frequency, although it may be different (e.g. a greater number of cycles may be used to determine the second frequency, if a greater accuracy is desired).

Determining the operational relationship may comprise comparing the difference between the first and second frequencies and the difference (i.e. the including the magnitude of the difference) between the first and second control values. For instance, a ratio between the frequency difference and the control value difference may be calculated to determine a gradient of a linear operational relationship.

In some embodiments, an operational relationship is determined each time the clock circuit portion is used and/or each time the operating conditions change. However, it may be advantageous to store the operational relationship that is determined during operation, so that it may be recalled next time it is applicable to save time. Therefore in some embodiments the method comprises:

measuring at least one operating condition;
storing the determined operational relationship between the control value and the frequency of the output clock signal with the corresponding operating condition(s).

The clock circuit portion may be arranged to store the determined operational relationship and its associated operating condition(s) in a storage portion (e.g. one that is part of the clock circuit portion or provided separately).

Over time (i.e. as operating conditions vary), a plurality of different operational relationships for different operating condition(s) may thus be built up. In such embodiments, when the clock circuit portion is used in an operating condition (or a set of conditions) that it has previously encountered, it does not need to determine the operational relationship again but can simply recall the relationship stored previously in order to set the second control value, saving time by avoiding the need to establish a third control value. However, if a new operating condition (or set of conditions) is encountered, the clock circuit portion can determine the operational relationship (e.g. as described above), before storing it (with its associated operating condition(s)) for later use. In some embodiments, therefore, the method may comprise:

measuring at least one operating condition;
determining whether an operational relationship between the control value and the frequency of the output clock signal has previously been stored that corresponds to the measured operating condition(s);
if an operational relationship has previously been stored that corresponds to the measured operating condition(s), recalling the corresponding operational relationship and using said relationship to determine the second control value; and if an operational relationship has not previously been stored that corresponds to the measured operating condition(s), determining an operational relationship.

The present invention may be particularly advantageous when there is a large offset between the nominal relationship and the actual (operational) relationship (e.g. when operating conditions differ significantly from those under which a calibration was performed), because such a large offset would conventionally take many cycles of the reference clock signal to correct by crawling at a fixed rate.

For instance, the embodiments herein may be particularly useful on start-up of the oscillator circuit portion, when switching from open-loop into closed-loop modes, when the target frequency is changed during use or when one or more operating conditions changes significantly during use. For instance, changes in ambient temperature or other conditions during a sleep period or a during a period of open loop operation may result in a large offset between nominal and actual frequencies when the oscillator subsequently starts up or begins closed-loop operation. The method may comprise operating the oscillator circuit portion in a sleep mode or an open-loop mode before (e.g. immediately prior to) providing the first control value or before comparing the output clock signal with the reference clock signal. In other words, the output clock signal may be produced on start-up or at the onset of closed-loop operation.

The embodiments extend to a method of operating an oscillator circuit portion configured to receive a control value and produce an output clock signal with a frequency dependent on the control value, the method comprising:

operating the oscillator circuit portion in a sleep mode or an open-loop mode;

subsequently providing a first control value to the oscillator circuit portion corresponding to a target frequency according to a predetermined nominal relationship, so as to cause the oscillator circuit portion to produce the output clock signal with a first frequency;

comparing the output clock signal with a reference clock signal having a reference frequency to determine an offset between the first frequency and the target frequency; and providing a second control value to the oscillator circuit portion that differs from the first control value by a magnitude calculated with reference to the determined offset, so as to cause the oscillator circuit portion to produce the output clock signal with a second frequency.

The Applicant has recognised that longer periods of sleep or open-loop operation may lead to a greater potential frequency drift. Thus, the embodiments may be particularly useful after periods of sleep or open-loop operation exceeding a certain duration. In some embodiments, the method comprises operating the oscillator circuit portion in a sleep mode or an open-loop mode for a duration longer than a predetermined threshold (i.e. before providing the first control value or before comparing the output clock signal with the reference clock signal). In embodiments comprising operating the oscillator circuit in an open-loop mode, the method may comprise operating the oscillator circuit portion in an open-loop mode for a duration longer than the predetermined threshold before comparing the output clock signal with the reference clock signal.

In some embodiments, the first control value comprises a previously-stored control value (e.g. stored in memory just prior to entering a sleep mode or open-loop mode). The stored value may then be restored (e.g. read from memory) at a later time (e.g. after a period of sleep or open-loop operation). The second control value may then correct for frequency drift that has occurred during the sleep or open-loop period. In some embodiments, the method comprises storing the first control value. The first control value may be stored prior to entering a sleep period or a period of open-loop operation (e.g. for use as the previously-stored first control value mentioned above after the sleep period or a period of open-loop operation).

When a period of sleep or open-loop operation is short, it may be useful to retain the (corrected) second control value. For instance, the frequency drift experienced during a short period of sleep or open-loop operation may be small, so retaining the previously applied second control value during this period may allow a target frequency to be regained quickly on wake or on initiation of closed-loop operation. In some embodiments, the method comprises storing the second control value (e.g. prior to entering a sleep period or a period of open-loop operation). The second control value may be stored only if the sleep period or the period of open-loop operation has an expected duration that is less than a predetermined threshold. The method may comprise determining an expected duration of an imminent or upcoming sleep period or period of open-loop operation.

Once an initial large offset is corrected, it may, in some circumstances, be acceptable to correct further errors by crawling. In some embodiments, therefore, the method further comprises subsequently adjusting the control value by a fixed amount for each cycle of the reference clock when an offset is detected between the frequency of the output clock signal and the target frequency.

The control value (e.g. the first, second and/or third control values) may comprise a single numerical value. However, in some embodiments the control value may comprise a coarse trim value and a fine trim value. The coarse trim value may comprise a value determined using a nominal relationship between the control value and the output frequency. The fine trim value may comprise a refinement of the course trim value. For example the first control value may be made up of a coarse trim value determined from a predefined or calibrated (i.e. factory-set) nominal relationship between the control value and the output frequency and a fine trim value equal to zero (as there is not yet any refinement). The second and/or third control values may, in such embodiments, comprise the same coarse trim value as the first control value, but with different (non-zero) fine trim values.

As mentioned above, the embodiments may be used on start-up or at the onset of closed-loop operation. In some embodiments, the coarse trim value (e.g. representing the first control value) may be stored prior to a period of sleep or open-loop operation, and then restored on start-up or at onset of closed-loop operation. In such cases, the fine trim value (e.g. used with the coarse trim value to define the second control value) may be reset to a default value (e.g. zero) prior to a period of sleep or open-loop operation. However in some cases where the expected duration of sleep or open-loop operation is short (and thus the likelihood of significant frequency shift is low), the fine trim value may also be stored prior to sleep or open-loop operation to allow the second control value (e.g. comprising a combination of coarse and fine control values) to be restored and the target frequency regained quickly at the subsequent wake or initiation of closed-loop operation.

The clock circuit portion may be configured to output a plurality of different target frequencies depending on an input parameter (e.g. chosen by a user or by software running on a separate processor). The target frequency is preferably more than 1 kHz and further preferably more than 1 MHz, such as 10 MHz or more, 100 MHz or more or even 1000 MHz or more. The reference frequency is preferably lower than the target frequency and may be several orders of magnitude lower than the target frequency. Preferably the reference frequency is less than 10 MHz, such as 1 MHz or less or even 100 kHz or less. In one preferred embodiment the target frequency is between 1 MHz and 16 MHz (e.g. 12 MHz) and the reference frequency is between 1 kHz and 100 kHz (e.g. 32.768 kHz).

There is also disclosed herein a clock generation circuit portion for producing an output clock signal with a target frequency comprising:

a controller configured to output a control value;

an oscillator configured to receive the control value and produce an output clock signal with a frequency dependent on the control value according to a nominal relationship; and a reference clock input for receiving a reference clock signal;

wherein the clock generation circuit portion is arranged:

to operate in a closed loop mode in which the controller is arranged to output a first control value corresponding to the target frequency based on the nominal relationship, to compare the output clock signal and the reference clock signal and to adjust the control value during operation to keep the output clock signal at the target frequency; and to operate in an open loop mode in which the controller is arranged to output a fixed second control value corresponding to a second frequency based on the nominal relationship, the second frequency being lower than the target frequency.

When operating in the open-loop mode, therefore, the frequency of the output clock signal is artificially skewed down (to the second frequency). Because the uncertainty in the frequency of the output signal is inherently larger in the open-loop mode (because it is not locked to the reference clock signal), artificially skewing down the frequency of the output clock signal thus reduces the likelihood of the frequency of the output clock signal exceeding a maximum allowable frequency (e.g. a maximum clock frequency at which other circuitry connected to the clock generation circuit portion can operate). This may avoid errors occurring or even damage being caused to the clock generation circuit portion or other connected circuitry.

In some embodiments, the controller may be arranged to apply a start-up control value (e.g. comprising a hard-coded control value). The start-up control value may correspond to a third frequency significantly below a maximum allowable frequency (i.e. without reference to the target frequency). The third frequency may be half or less of a maximum allowable frequency. The start-up control value may be used on an initial power-up of the clock generation circuit (e.g. before any calibrated control values stored in memory are available). The start-up control value may represent a "safe" control value that ensures a clock signal does not exceed the maximum allowable frequency even with an extreme variation.

Because it is not necessarily known in advance whether closed-loop mode operation will be available in a certain implementation (e.g. for implementations where the provision of a reference clock is not guaranteed), it is advantageous to ensure that in any mode of operation a maximum frequency limit for the output clock signal is not exceeded. In the closed-loop mode this is achieved by locking the output clock signal to the (more accurate) reference clock signal, and in the open-loop mode this is achieved by artificially skewing-down the output frequency so that the maximum frequency limit is not exceeded even if the uncertainty is high.

BRIEF DESCRIPTION OF THE DRAWINGS

One or more non-limiting examples of the present disclosure will now be described with reference to the accompanying Figures, in which.

DETAILED DESCRIPTION

Figure 1:
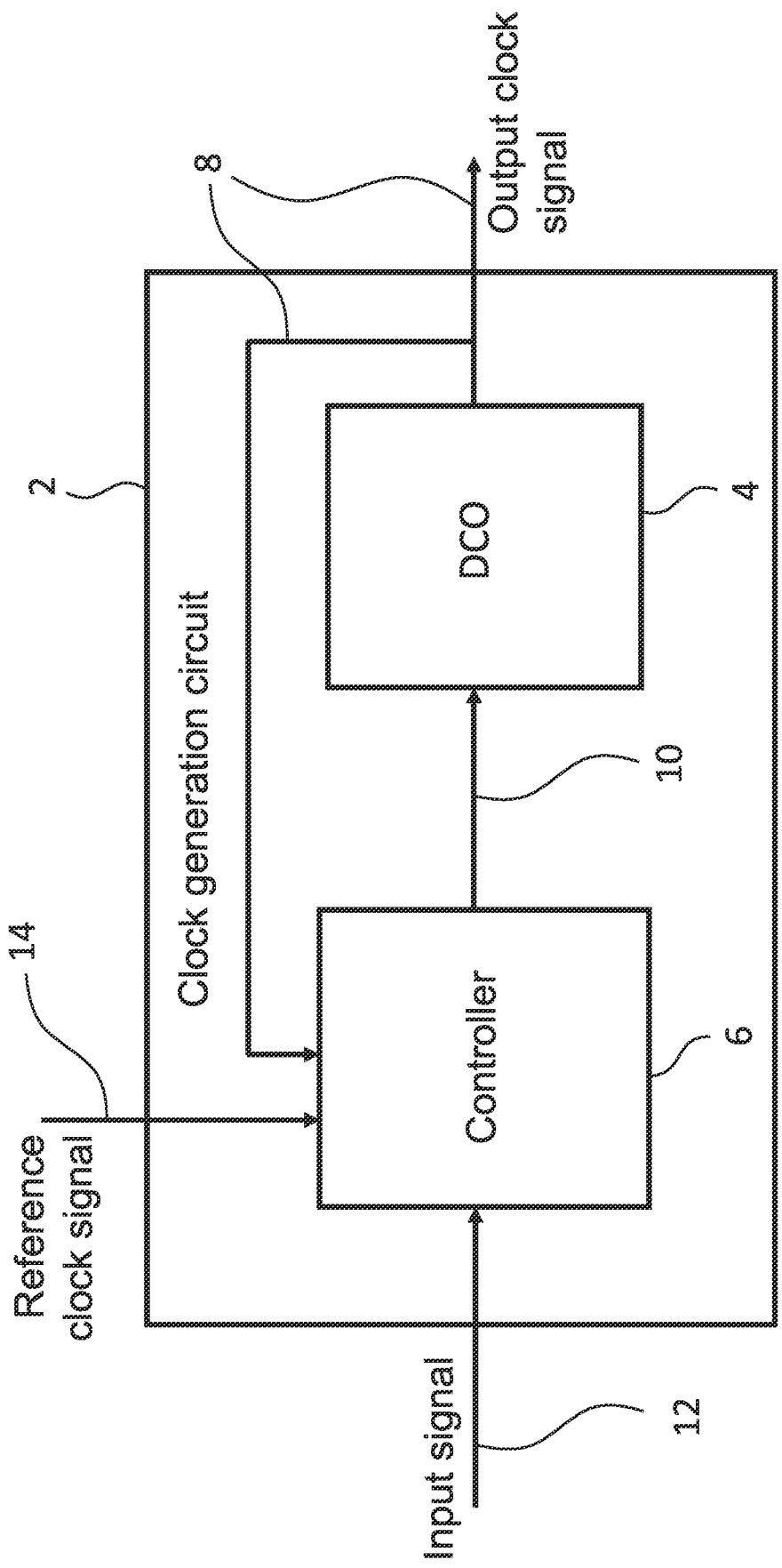
FIG. 1 is a block diagram of a clock generation circuit according to one embodiment.

A clock generation circuit 2 comprises a digitally-controlled oscillator (DCO) 4 and a controller 6. The clock generation circuit 2 is arranged to output an output clock signal 8 that is produced by the DCO 4. The output clock signal 8 has a frequency $f_{output}$ that is dependent on a digital control value 10 provided by the controller 6.

The digital control value 10 output by the controller 6 is determined based on an input signal 12, a reference clock signal 14 and the clock signal 8, which is fed back from the DCO 4. The reference clock signal 14 is provided by an reference clock (not shown), such as a 32.768 kHz crystal oscillator circuit, that is highly accurate but has a frequency that is many times slower than the output clock signal 8.

Figure 2:
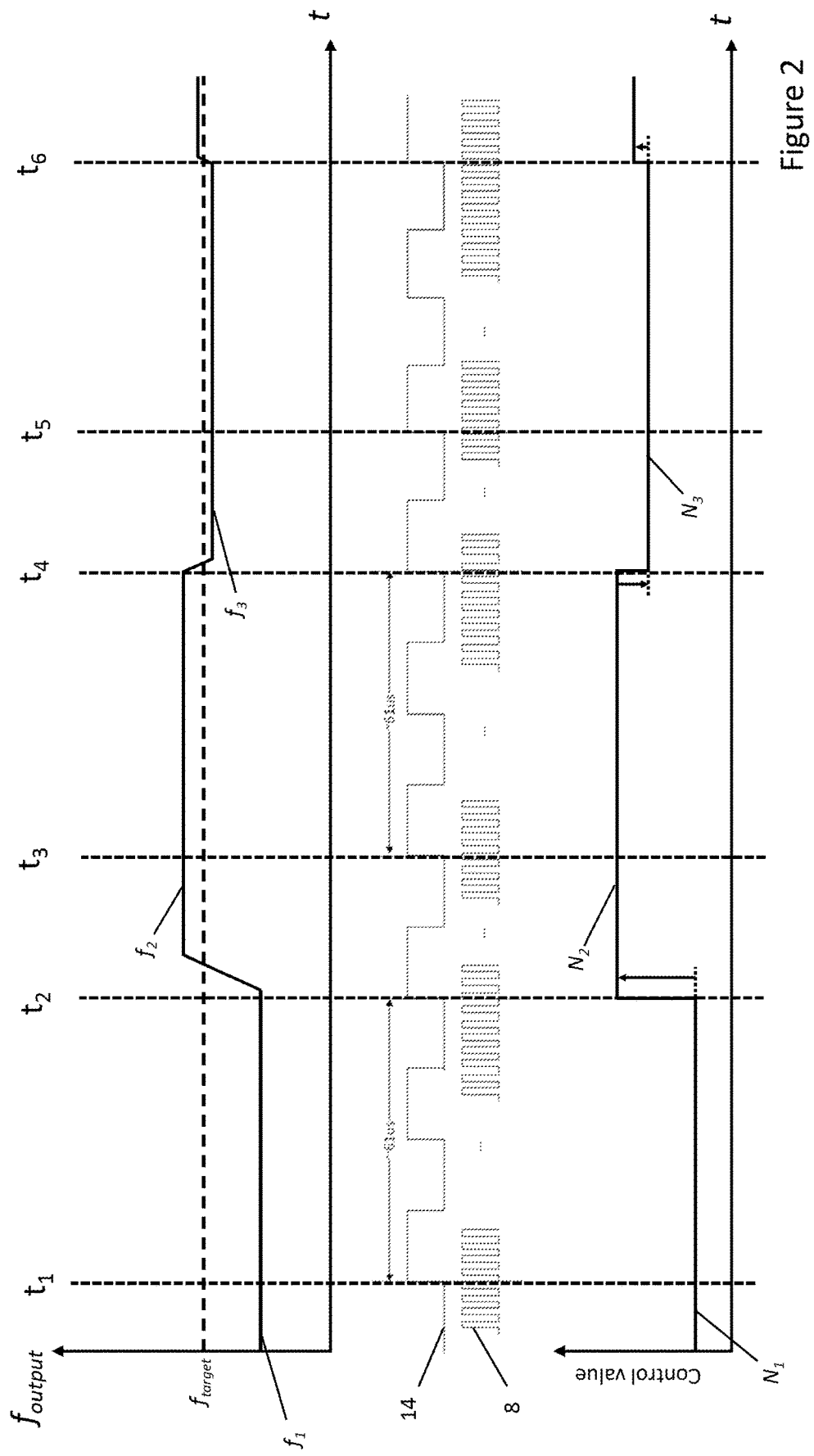
FIG. 2 is a timing diagram illustrating operation of the clock generation circuit of FIG. 1.
Figure 3:
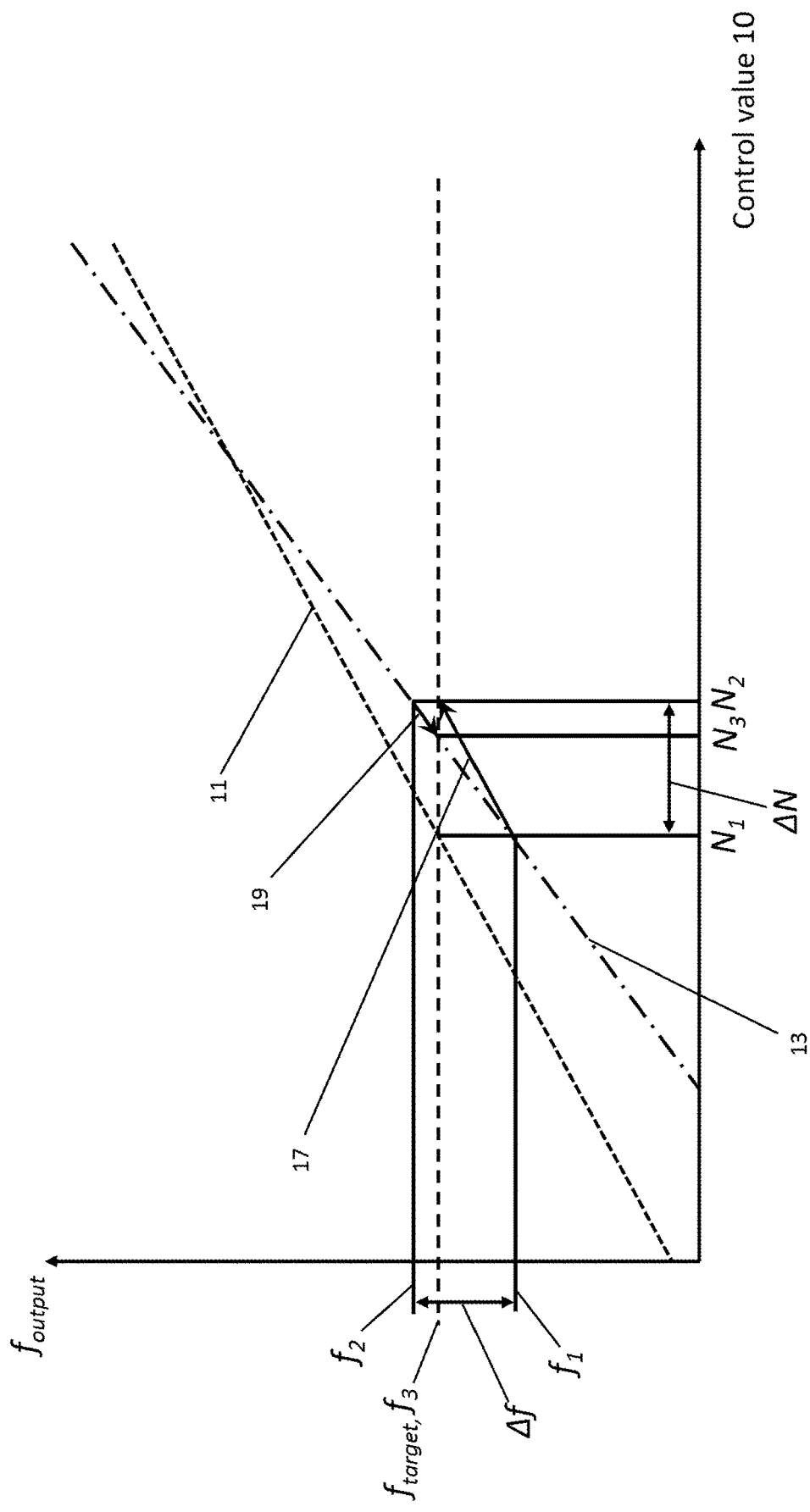
FIG. 3 is a graph showing the relationship between a control value and the frequency of an output clock signal of the embodiment of FIG. 1.
Figure 9:
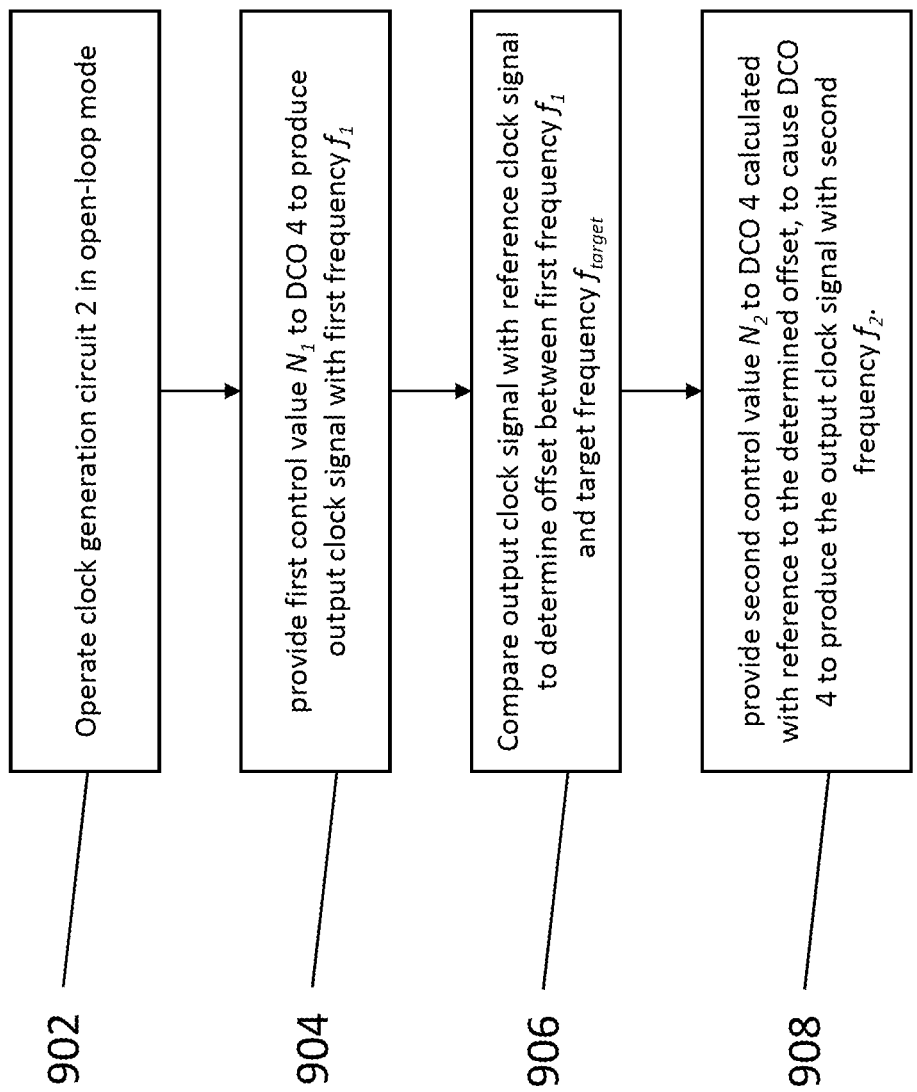
FIG. 9 is a flow diagram illustrating operation of the clock generation circuit of FIG. 1.

The operation of the clock generation circuit 2 will now be explained with reference to the timing diagram shown in FIG. 2, the plot shown in FIG. 3 and the flow diagram shown in FIG. 9.

In step 902, prior to an initial time $t_1$, the clock generation circuit 2 is operated in an open-loop mode. In other examples the clock generation circuit 2 may be operated in a sleep mode before the initial time $t_1$. At time $t_1$, the input signal 12 identifies a target frequency $f_{target}$ for the output clock signal 8. The target frequency $f_{target}$ may be selected by a user or by software running on a separate processor (not shown).

The DCO 4 is calibrated during manufacture to determine a nominal relationship 11 (e.g. a linear relationship) between the control value 10 and the frequency $f_{output}$ of the output clock signal 8. This nominal relationship 11 is shown with the dashed line in FIG. 3. As shown in FIG. 3, in step 904 the nominal relationship 11 is used by the controller 6 to determine a first control value $N_1$ that should cause the DCO 4 to generate an output clock signal with the target frequency $f_{target}$.

However, the conditions (e.g. the ambient temperature) in which the DCO 4 is operated differ from those used when determining the nominal relationship 11. The actual ("operational") relationship 13 between the control value 10 and the output frequency $f_{output}$ is shown with a dot-dashed line in FIG. 3. The frequency $f_{output}$ of the output clock signal 8 when the first control value $N_1$ is input is therefore $f_1$, where $f_1 \neq f_{target}$.

In step 906, in order to determine the frequency $f_1$, the controller 6 counts the number of cycles of the output signal 8 elapsing for two cycles of the reference clock signal 14. Once these two cycles have elapsed, at time $t_2$, the controller 6 determines $f_1$ and calculates an offset between $f_1$ and the target frequency $f_{target}$.

Using the gradient of the (predetermined) nominal relationship 11, the controller 6 determines a magnitude $\Delta N$ by which the first control value $N_1$ should be changed to achieve the target frequency $f_{target}$. In step 908, a second control value $N_2$ that differs from the first control value $N_2$ by this magnitude $\Delta N$ is calculated and input to the DCO 4 at time $t_2$ (or momentarily thereafter), to produce an output clock signal 8 with a second frequency $f_2$. The change from the first control value $N_1$ to the second control value $N_2$ and from the first frequency $f_1$ to the second frequency $f_2$ is shown in FIG. 3 as a first correction 17, which has the same gradient as the nominal relationship 11. It can be seen in FIGS. 2 and 3 that the second frequency $f_2$ is much closer to $f_{target}$ than $f_1$.

However, there remains a small offset between $f_{target}$ and $f_2$. After allowing one cycle of the reference clock 14 for the second frequency $f_2$ to stabilise, at $t_3$ the controller 6 again counts the number of cycles of the output signal 8 elapsing for two cycles of the reference clock 14 to determine $f_2$.

At $t_4$, this count is used to determine $f_2$, and a difference $\Delta f$ between the first and second frequencies $f_1$, $f_2$. The difference $\Delta f$ is then divided by the change $\Delta N$ between $N_1$ and $N_2$, to determine the gradient of the operational relationship 13 (i.e. the actual relationship between the control value 10 and the output frequency $f_{output}$).

Now the gradient of the operational relationship 13 is known, it can then be used to calculate a third control value $N_3$ to bring the output frequency $f_{output}$ to the target frequency $f_{target}$. This is input to the DCO 4 just after $t_4$, causing the DCO 4 to output an output clock signal 8 with a frequency $f_3$ that is very close to the target frequency $f_{target}$ (e.g. within a predetermined tolerance of $f_{target}$). The change from the second control value $N_2$, to the third control value $N_3$ and from the second frequency $f_2$ to the third frequency $f_3$ is shown in FIG. 3 as a second correction 19, which has the same gradient as (i.e. is parallel to) the actual operational relationship 13.

Thus, despite the first frequency $f_1$ being quite different to $f_{target}$ at $t_1$, the clock generation circuit 2 produces an output clock signal 8 with a frequency $f_3$ that is acceptably close to $f_{target}$ within only six cycles of the reference clock signal 14 (e.g. within 200 µs for a 32.768 kHz reference clock frequency).

Once the target frequency $f_{target}$ is achieved, the clock generation circuit 2 reverts to a "crawling mode" in which the control value 10 is shifted up or down by only one for each cycle of the reference clock signal 14 in response to detected shifts in output frequency $f_{output}$ (see, e.g. a measurement interval starting at $t_5$ and a crawling step in the control value 10 at $t_6$). Because the factors affecting the output frequency $f_{target}$ (e.g. ambient temperature, humidity) generally change slowly, this crawling mode is sufficient to maintain accurate operation at $f_{target}$ once the initial offset seen at $t_1$ has been corrected.

The clock generation circuit 2 may subsequently return to a period of open-loop operation. If the expected duration of this period of open-loop operation is less than a predetermined threshold (i.e. if the duration is short enough to render significant frequency drift unlikely), the most recently applied control value 10 may be stored to allow the target frequency to be attained quickly afterwards. If the expected duration of this period of open-loop operation is greater than the predetermined threshold, the control value 10 may simply be reset (e.g. to a default value, or to first control value $N_1$).

Figure 4:
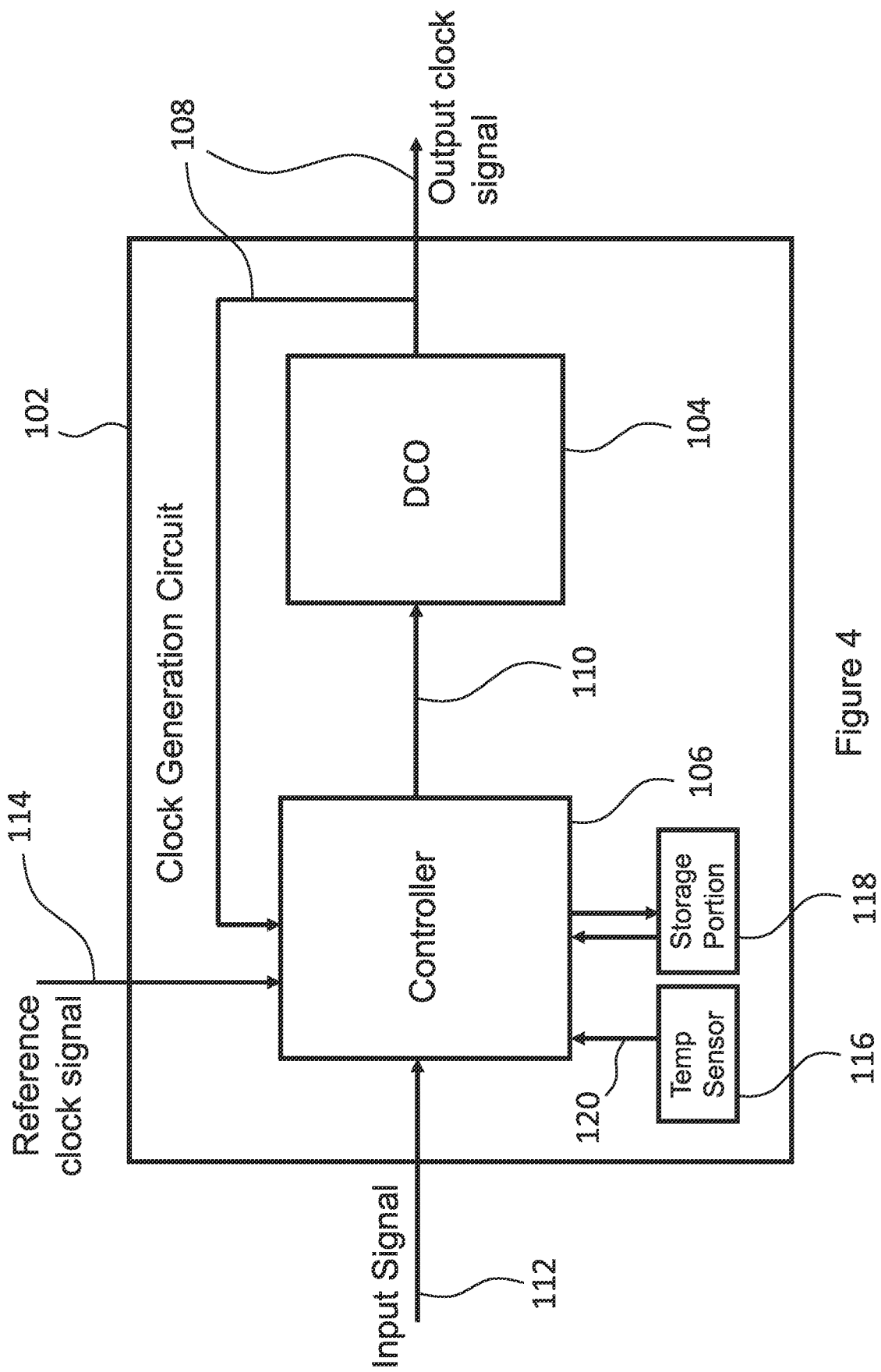
FIG. 4 is a block diagram of a clock generation circuit according to another embodiment.

FIG. 4 shows another clock generation circuit 102 that comprises a digitally-controlled oscillator (DCO) 104, a controller 106, a temperature sensor 116 and a storage portion 118 (e.g. a non-volatile memory). As with the clock generation circuit 2 described with reference to FIGS. 1-3, the clock generation circuit 102 of FIG. 4 is arranged to output an output clock signal 108 that is produced by the DCO 104. The output clock signal 108 has a frequency that is dependent on a digital control value 110 provided by the controller 106. An input signal 112 to the controller 106 identifies a target frequency $f_{target}$ for the output clock signal 108.

Figure 5:
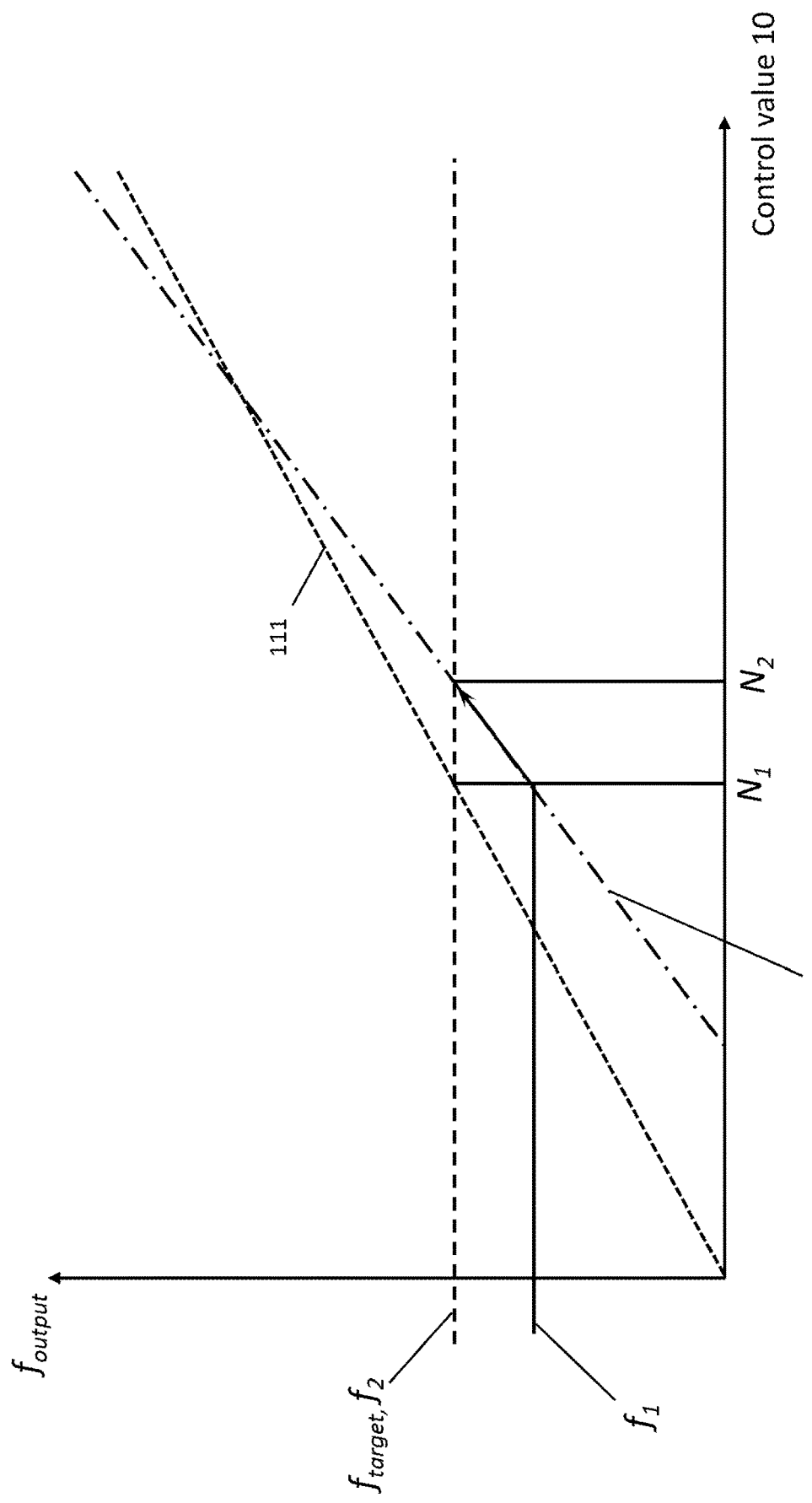
FIG. 5 is a graph showing the relationship between a control value and the frequency of an output clock signal of the embodiment of FIG. 4.

The operation of the clock generation circuit 102 will now be described with reference to FIG. 5, which shows a nominal relationship 111 (e.g. determined during manufacture for a nominal set of operating conditions) and an operational relationship 113 (for the actual conditions in which the clock generation circuit 102 is being used) between the control value 110 and the frequency of the output clock signal 108. As with the clock generation circuit 2 described with reference to FIGS. 1-3, the nominal relationship 111 is used by the controller 106 to determine a first control value $N_1$ that should cause the DCO 104 to generate an output clock signal with a target frequency $f_{target}$.

However, due to differences between the conditions under which the nominal relationship 111 was determined and the actual conditions in which the clock generation circuit 102 is being used, the output frequency $f_1$ for $N_1$ is not equal to the target frequency $f_{target}$. For instance, in this example the nominal relationship 111 was determined for an ambient temperature of 20° C., but the current ambient temperature is 40° C.

The controller 106 counts the number of cycles of the output signal 108 elapsing for two cycles of the reference clock signal 114, to determine $f_1$ and subsequently the offset between $f_1$ and the target frequency $f_{target}$.

The controller 106 also uses the temperature sensor 116 to measure the current ambient temperature, which is 40° C. The controller 106 then consults the storage portion 118 to see if an operational relationship 113 corresponding to an ambient temperature of 40° C. is stored. In this case there is and the operational relationship 113 is recalled. The gradient of the operational relationship 113 and the offset between $f_1$ and the target frequency $f_{target}$ are used to determine a magnitude $\Delta N$ by which the first control value $N_1$ should be changed to achieve the target frequency $f_{target}$. A second control value $N_2$, that differs from the first control value $N_2$ by this magnitude $\Delta N$, is calculated and input to the DCO 104 to produce an output clock signal 108 with a second frequency $f_2$, which is equal to $f_{target}$.

Because the operational relationship 113 for the current operating conditions (i.e. 40° C.) is already stored in the storage portion 118, the target frequency $f_{target}$ is achieved within only a few cycles of the reference clock signal 114. If there was no such operational relationship 113 already stored, the clock generation portion 102 may perform a method such as that described above with reference to FIGS. 1-3 to determine the operational relationship 113. This may then be stored to the storage portion 118 for future use. Over time, therefore, a database of operational relationships 113 may be built up for a range of operating conditions.

Figure 6:
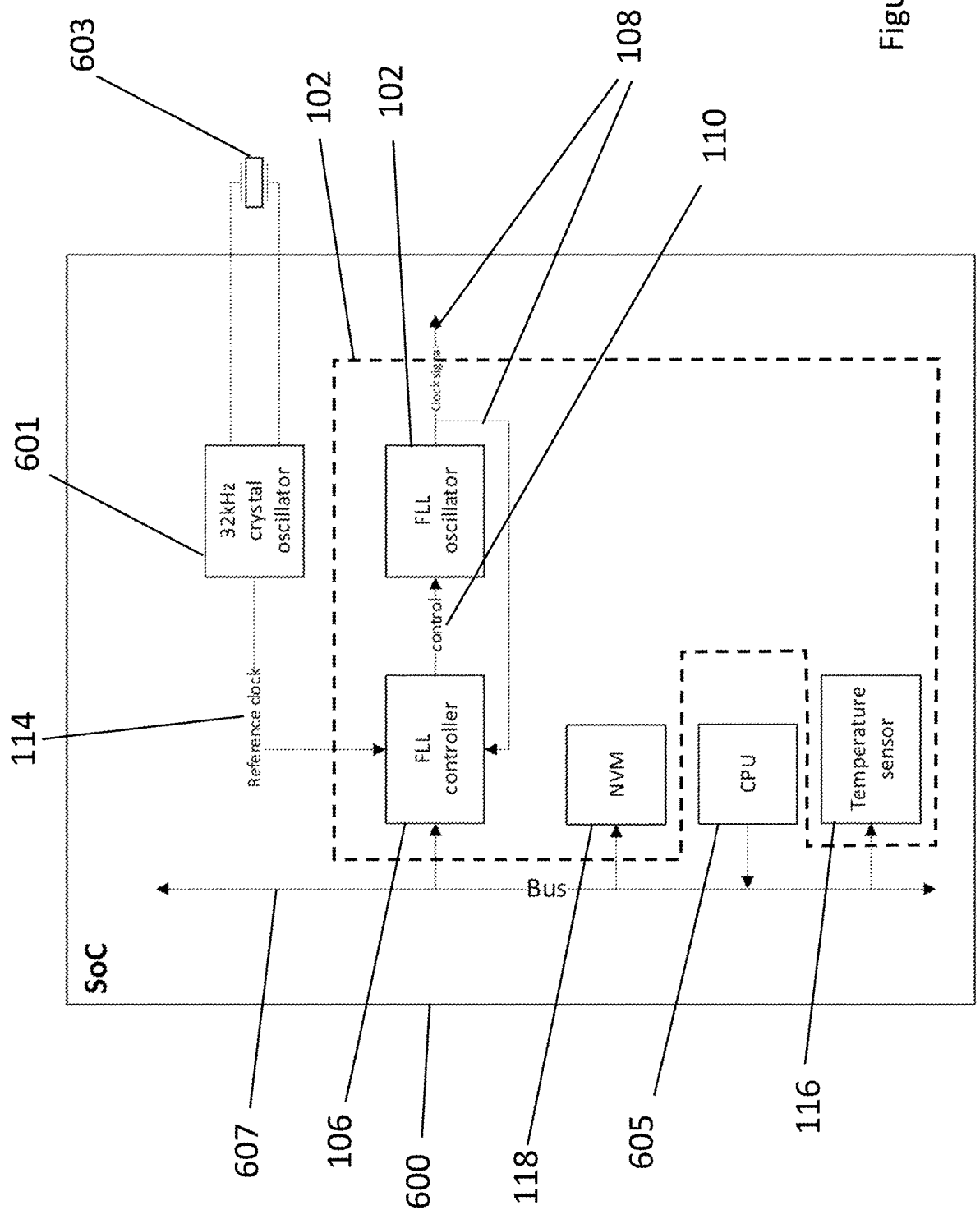
FIG. 6 is a block diagram of a System-on-Chip on which embodiments invention may be implemented.

FIG. 6 shows a System-on-Chip (SoC) 600 in which the clock generation circuit 102 is implemented. SoC 600 comprises a 32 kHz crystal oscillator 601, connected to an external crystal 603 that generates the reference clock signal 114. The SoC 600 also comprises a CPU 605.

The SoC 600 also comprises a bus 607 over which the controller 106, the CPU 605, the temperature sensor 116 and the storage portion 118 communicate. The CPU 605 may provide the input signal 112 that defines the target frequency $f_{target}$.

Figure 7:
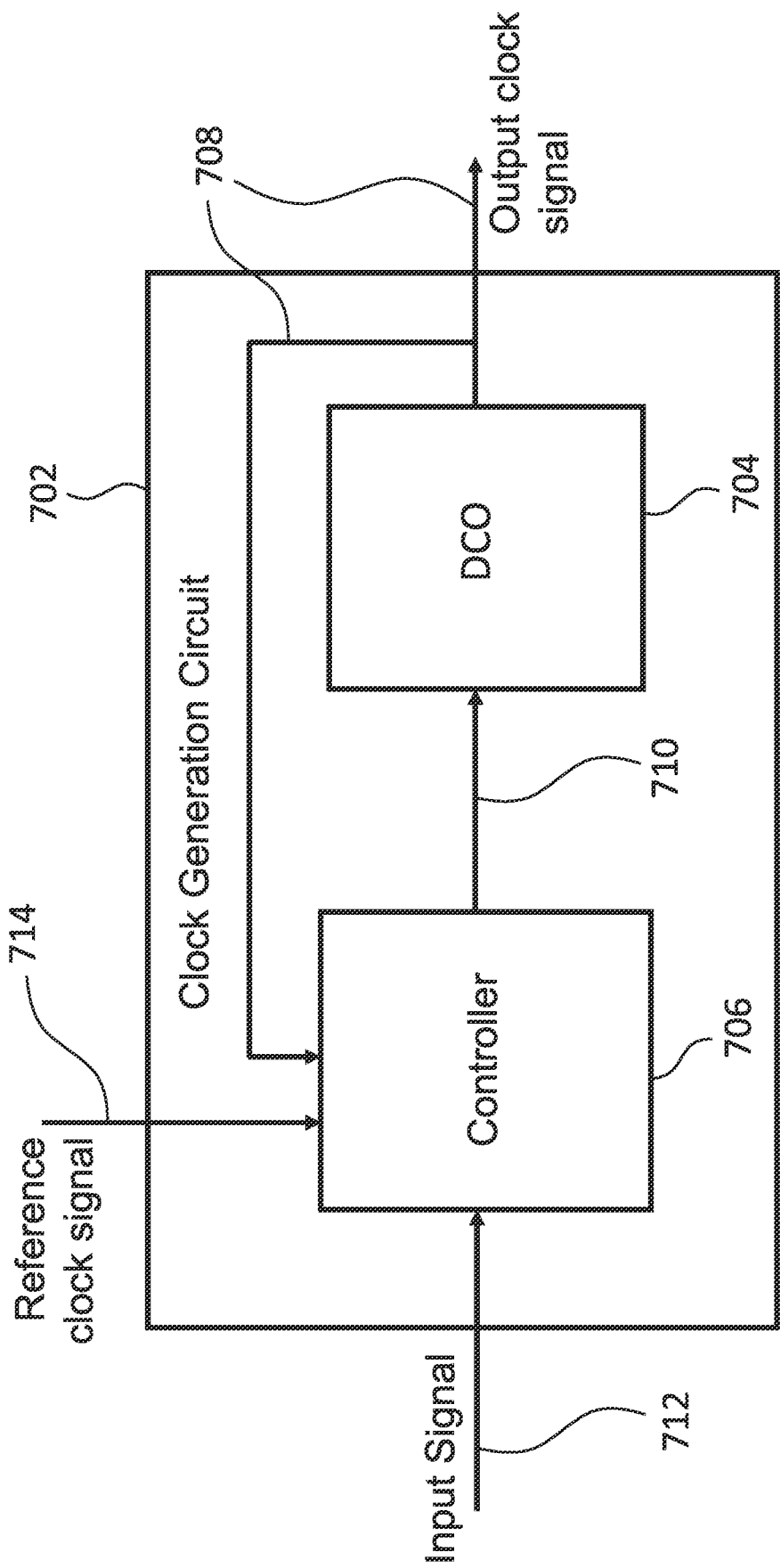
FIG. 7 is a block diagram of another clock generation circuit.

FIG. 7 shows a clock generation circuit 702 comprising a digitally-controlled oscillator (DCO) 704 and a controller 706. The clock generation circuit 702 is arranged to output an output clock signal 708 that is produced by the DCO 704. The output clock signal 708 has a frequency that is dependent on a digital control value 710 provided by the controller 706.

The digital control value 710 output by the controller 706 is determined based on an input signal 712. The input signal 712 identifies a target frequency $f_{target}$ for the output clock signal 708. The target frequency $f_{target}$ may be selected by a user or by software running on a separate processor (not shown).

The DCO 704 is calibrated during manufacture to determine a nominal relationship (e.g. a linear relationship) between the control value 710 and the frequency of the output clock signal 708. This nominal relationship is used by the controller 706 to determine the control value 710 that should be output to cause the oscillator 704 to output an output clock signal 708 with the target frequency $f_{target}$.

The clock generation circuit 702 is operable in closed-loop and open-loop modes. In the closed-loop mode, the digital control value 710 output by the controller 706 is determined based on an input signal 712, a reference clock signal 714 and the clock signal 708, which is fed back from the DCO 704. The reference clock signal 714 is provided by an reference clock (not shown), such as a 32.768 kHz crystal oscillator circuit, that is highly accurate but has a frequency that is many times slower than the output clock signal 708.

Figure 8:
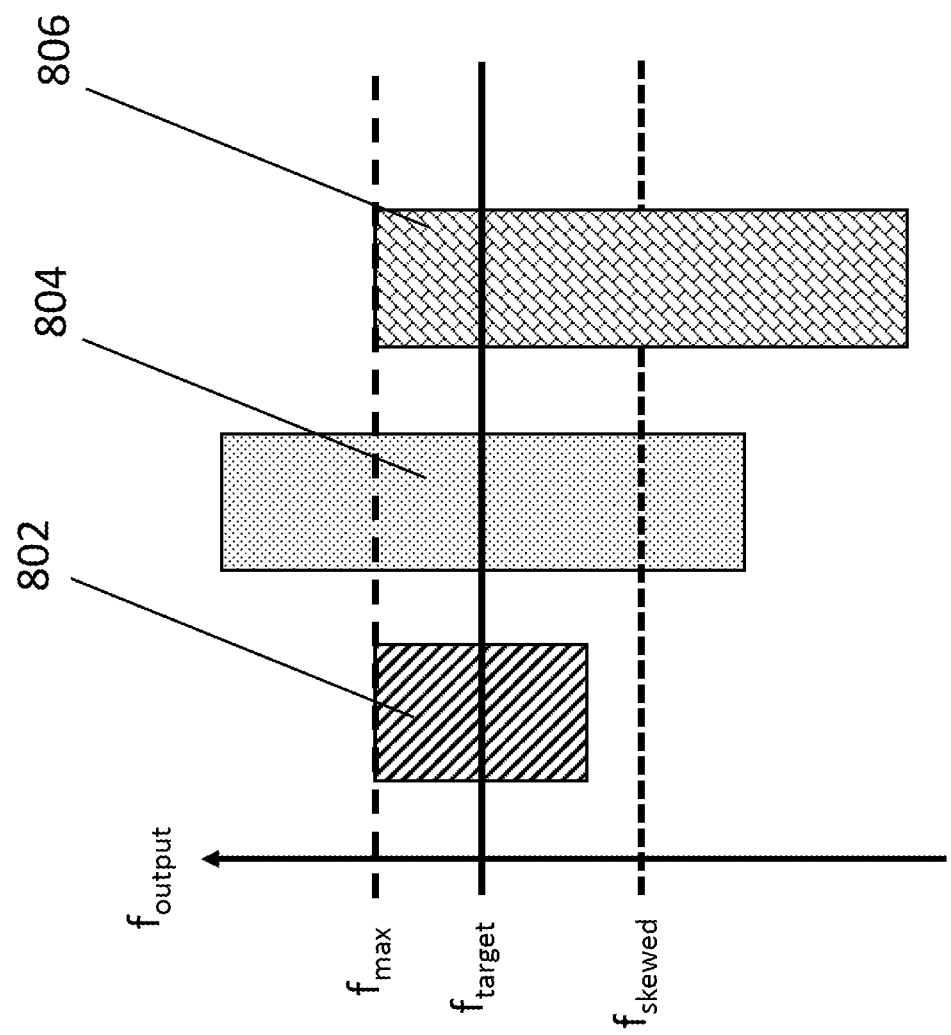
FIG. 8 is a graph showing uncertainties in the frequency of the output clock signal from the clock generation circuit of FIG. 7 for different modes of operation.

In the closed-loop mode, the controller 706 continually compares the fed-back clock signal 708 to the reference clock signal 714 to identify any deviation of the clock signal 708 from the target frequency $f_{target}$ and adjusts the control value 710 accordingly to compensate. This is referred to as locking the output clock signal 708 to the reference clock signal 714. The reference clock 714 is very accurate, i.e., the frequency of the reference lock signal 714 is always within ±2% of its nominal value. Because the output clock signal 708 is locked to the reference clock signal 714, it is also accurate to within ±2% of the target frequency $f_{target}$. This accuracy is illustrated in FIG. 8, which shows the uncertainty 802 around the target frequency $f_{target}$ in the output clock signal 714 when in closed-loop mode. When the clock generation circuit 702 is operable in the closed-loop mode, a user can be confident that the frequency of the output signal 708 will be as accurate as the reference clock signal (in this case to ±2%).

In the open-loop mode, no reference clock signal 714 is provided, and there is no feedback from the oscillator 704 to the controller 706 or continual adjustment of the control value 710. Instead, the control value 710 is simply set at the value that will produce $f_{target}$ according to the nominal relationship between the control value 710 and the frequency of the output clock signal 708 and remains unchanged throughout operation. This is also referred to as "free-running" mode.

The inherent accuracy of the oscillator 704 is, however, much lower than that of the reference clock signal 714. When in open-loop mode, the frequency of the output clock signal 708 may vary by as much as ±5%. This is illustrated in FIG. 8, which shows the uncertainty 804 around the target frequency $f_{target}$ in the output clock signal 708 when in a conventional open-loop mode.

FIG. 8 also shows a maximum allowable frequency $f_{max}$, which, in this case, is 2% above $f_{target}$. The maximum allowable frequency $f_{max}$ may simply be the maximum frequency the clock generation circuit 702 is specified as providing (e.g. to enable users to properly design circuitry to which the clock generation circuit 702 is connected that does not need to be over-specified which would consume additional power in normal use). For example, unillustrated circuitry connected to the clock generation circuit 702 may be unable to cope with a clock frequency exceeding $f_{max}$.

In closed-loop operation, the uncertainty 802 in the frequency of the output signal 708 in the closed loop mode is only ±2%, so a user can be confident that the maximum frequency $f_{max}$ (which is 2% above $f_{target}$) will not be exceeded. However in conventional open-loop operation, the uncertainty 804 is ±5% and extends above the $f_{max}$ (which is at +2%). Thus a user cannot be confident that the frequency of the output clock signal 708 will remain under the maximum frequency $f_{max}$ when the circuit 702 is operated in a conventional open-loop mode.

The clock generation circuit 702 is therefore operable in a skewed open-loop mode. As with the conventional open-loop mode, in this mode no reference clock signal 714 is provided, and there is no feedback from the oscillator 704 to the controller 706 or continual adjustment of the control value 710. However, instead of the control value 710 being set at the value that will produce $f_{target}$ according to the nominal relationship, the control value 710 is set at a value that will produce an artificially down-skewed frequency $f_{skewed}$, that is 3% lower than $f_{target}$. This means that even with a ±5% uncertainty (shown as 806 in FIG. 7), the frequency of the output signal 708 will not exceed $f_{max}$. Instead, the uncertainty 806 ranges from −8% to +2%. Even though this may lead to a frequency up to 8% lower than the target frequency, a user can be confident that even in open-loop mode the maximum frequency $f_{max}$ will not be exceeded.

Although some particular embodiments have been described in detail, many variations and modifications are possible whilst remaining within the scope of the invention.

We claim:

1. A method of producing an output clock signal with a target frequency using an oscillator circuit portion configured to receive a control value and produce an output clock signal with a frequency dependent on the control value; wherein the method comprises:
providing a first control value to the oscillator circuit portion corresponding to the target frequency according to a predetermined nominal relationship, so as to cause the oscillator circuit portion to produce the output clock signal with a first frequency;
comparing the output clock signal with a reference clock signal having a reference frequency to determine an offset between the first frequency and the target frequency, wherein comparing the output clock signal with the reference clock signal comprises counting a number of cycles of the output clock signal elapsing within a predetermined number of cycles of the reference clock signal; and providing a second control value to the oscillator circuit portion that differs from the first control value by a magnitude calculated with reference to the determined offset, so as to cause the oscillator circuit portion to produce the output clock signal with a second frequency.

2. The method as claimed in claim 1 wherein the predetermined number of cycles of the reference clock signal is one or two.

3. The method as claimed in claim 1, wherein the second control value is calculated with reference to the predetermined nominal relationship between control value and frequency of the output clock signal.

4. The method as claimed in claim 1, wherein the clock circuit portion is arranged to store a plurality of operational relationships for different operating conditions.

5. The method as claimed in claim 1, further comprising:
measuring at least one operating condition;
recalling a corresponding operational relationship between the control value and the frequency of the output clock signal; and
calculating the magnitude with which the second control value differs from the first control value with reference to the recalled operational relationship.

6. The method as claimed in claim 1, further comprising:
measuring the second frequency
calculating a difference between the first frequency and the second frequency;
determining an operational relationship between the control value and the frequency of the output clock signal;
selecting a third control value with reference to the determined operational relationship; and
providing said third control value to the oscillator circuit portion so as to cause the output clock signal to produce the output clock signal with a third frequency.

7. The method as claimed in claim 6, wherein measuring the second frequency comprises counting a number of cycles of the output clock signal elapsing within a second predetermined number of cycles of the reference clock signal.

8. The method as claimed in claim 6, wherein determining the operational relationship comprises comparing the difference between the first and second frequencies and the difference between the first and second control values.

9. The method as claimed in claim 6, further comprising:
measuring at least one operating condition;
storing the determined operational relationship between the control value and the frequency of the output clock signal with the corresponding operating condition(s).

10. The method as claimed in claim 1, comprising:
measuring at least one operating condition;
determining whether an operational relationship between the control value and the frequency of the output clock signal has previously been stored that corresponds to the measured operating condition(s);
if an operational relationship has previously been stored that corresponds to the measured operating condition(s), recalling the corresponding operational relationship and using said relationship to determine the second control value; and
if an operational relationship has not previously been stored that corresponds to the measured operating condition(s), determining an operational relationship.

11. The method as claimed in claim 1, further comprising subsequently adjusting the second control value by a fixed amount for each cycle of the reference clock when an offset is detected between the frequency of the output clock signal and the target frequency.

12. The method as claimed in claim 1, wherein the control value comprises a coarse trim value and a fine trim value.

13. The method as claimed in claim 1, wherein the target frequency is between 1 MHz and 16 MHz and the reference frequency is between 1 kHz and 100 kHz.

14. The method as claimed in claim 1, wherein the first control value comprises a previously-stored control value.

15. The method as claimed in claim 1, comprising storing the second control value prior to entering a sleep period or a period of open-loop operation.

16. The method as claimed in claim 15, comprising storing the second control value only if the sleep period or a period of open-loop operation has an expected duration that is less than a predetermined threshold.

17. A method of operating an oscillator circuit portion configured to receive a control value and produce an output clock signal with a frequency dependent on the control value, the method comprising:
operating the oscillator circuit portion in a sleep mode or an open-loop mode;
subsequently providing a first control value to the oscillator circuit portion corresponding to a target frequency according to a predetermined nominal relationship, so as to cause the oscillator circuit portion to produce the output clock signal with a first frequency;
comparing the output clock signal with a reference clock signal having a reference frequency to determine an offset between the first frequency and the target frequency, wherein comparing the output clock signal with the reference clock signal comprises counting a number of cycles of the output clock signal elapsing within a predetermined number of cycles of the reference clock signal; and
providing a second control value to the oscillator circuit portion that differs from the first control value by a magnitude calculated with reference to the determined offset, so as to cause the oscillator circuit portion to produce the output clock signal with a second frequency.

18. The method as claimed in claim 17, comprising operating the oscillator circuit portion in a sleep mode or an open-loop mode for a duration longer than a predetermined threshold before providing the first control value or before comparing the output clock signal with the reference clock signal.

19. A clock circuit portion configured to produce an output clock signal with a target frequency comprising:
a controller configured to output a control value;
an oscillator configured to receive the control value and produce an output clock signal with a frequency dependent on the control value; and
a reference clock input configured to receive a reference clock signal with a reference frequency;
wherein the controller is configured:
to output a first control value corresponding to the target frequency according to a predetermined nominal relationship, so as to cause the oscillator to produce the output clock signal with a first frequency;

to compare the output clock signal with the reference clock signal to determine an offset between the first frequency and the target frequency, wherein comparing the output clock signal with the reference clock signal comprises counting a number of cycles of the output clock signal elapsing within a predetermined number of cycles of the reference clock signal; and to output a second control value that differs from the first by a magnitude calculated with reference to the determined offset so as to cause the oscillator to produce the output clock signal with a second frequency.

* * * * *